United States Patent [19]

Maniar

[11] Patent Number: 5,271,955
[45] Date of Patent: Dec. 21, 1993

[54] METHOD FOR MAKING A SEMICONDUCTOR DEVICE HAVING AN ANHYDROUS FERROELECTRIC THIN FILM

[75] Inventor: Papu Maniar, Austin, Tex.

[73] Assignee: Motorola, Inc., Schaumburg, Ill.

[21] Appl. No.: 864,281

[22] Filed: Apr. 6, 1992

[51] Int. Cl.$^5$ .............................................. B05D 5/12
[52] U.S. Cl. .................. 427/100; 427/126.2; 427/126.3; 427/126.4; 427/226; 427/240; 427/372.2; 427/384; 437/231
[58] Field of Search ............... 427/126.2, 126.3, 226, 427/240, 372.2, 384, 126.4, 100; 437/231

[56] References Cited

U.S. PATENT DOCUMENTS 5,160,762  11/1992  Brand et al. ...................... 427/126.3

OTHER PUBLICATIONS

GAF Corporation, Chemical Division (1972), M-PYROL®, N-Methyl-2-Pyrrolidone, Handbook, pp. 38 and 52, (mo. & yr. unavailable).

Primary Examiner—Janyce Bell
Attorney, Agent, or Firm—Jasper W. Dockrey

[57] ABSTRACT

A method for making a semiconductor device having an anhydrous ferroelectric thin film obtained from an anhydrous sol-gel solution. An anhydrous PZT sol-gel solution is prepared from Lead (II) Acetate Anhydrous which is thermally reacted with Zirconium and Titanium precursors to form a gel condensate. The sol-gel condensate is prepared without hydrolyzing the sol-gel solution to obtain precursor complexes which do not contain water. The formulation of the sol-gel exclusively by thermal condensation and in the absence of hydrolysis yields an anhydrous amorphous sol-gel having a uniform condensate composition. The anhydrous PZT thin film formed by the anhydrous sol-gel exhibits improved durability and substantially complete low-temperature conversion to the perovskite crystalline phase.

21 Claims, 1 Drawing Sheet

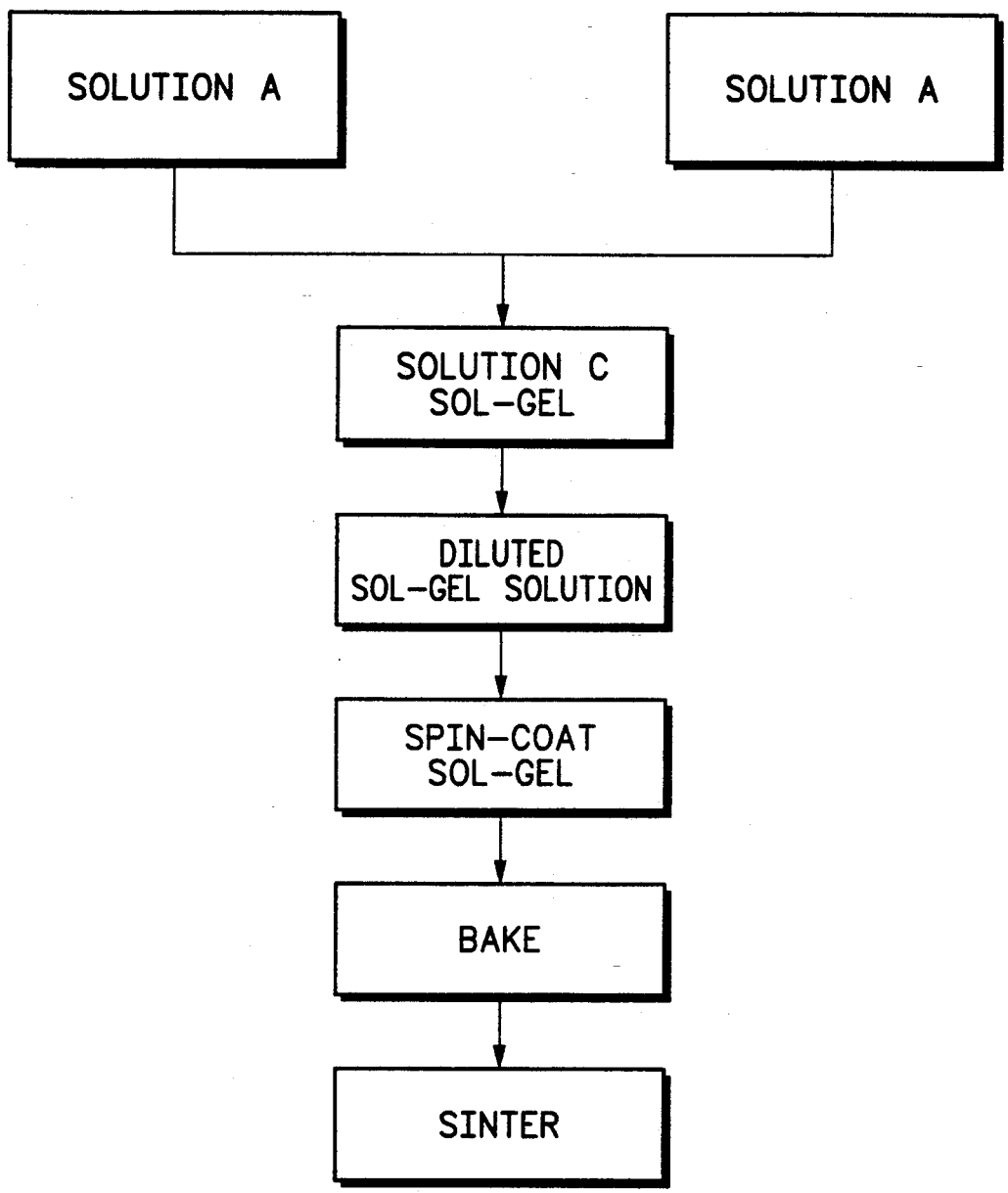
*FIGURE*

METHOD FOR MAKING A SEMICONDUCTOR DEVICE HAVING AN ANHYDROUS FERROELECTRIC THIN FILM

FIELD OF THE INVENTION

This invention relates, in general to a method for fabricating a semiconductor device, and more particularly, to a method for fabricating a semiconductor device having an anhydrous PZT ferroelectric thin film formed by the application of a sol-gel solution to a semiconductor substrate.

BACKGROUND OF THE INVENTION

As the overall dimensions of semiconductor devices continue to shrink, the demand is ever increasing for devices having high charge storage capacity. The need for high charge storage capability is a result of the reduction in the chip area available for individual components as circuits are scaled to smaller dimensions. As the surface area of a component, such as a capacitor is reduced, a corresponding reduction in charge storage capability occurs. The smaller surface area available for components such as transistors, capacitors, and the like, coupled with the requirement to maintain high charge storage levels has led researchers in the field of fabrication science to seek new materials from which to construct the components. One group of promising new dielectric materials is the family of PZT ceramic dielectrics. The PZT dielectrics are ferroelectric compounds of lead, zirconium and titanium oxides; hence the acronym PZT.

Ferroelectric compounds are capable of being polarized by an applied voltage and retaining the polarization after the applied voltage has been removed. Responding to an applied voltage, the ferroelectric material assumes one of two remanent polarization states after the applied voltage is withdrawn. The ability to polarize a PZT ferroelectric and to design circuitry to detect the polarization state, makes the ferroelectric a desirable compound from which to construct non-volatile memory devices such as non-volatile random access memory devices, and the like.

Thin films of PZT ferroelectric materials are commonly formed on semiconductor substrates using sol-gel process technology. Sol-gel processing provides a means of forming a thin PZT layer on a semiconductor substrate using existing spin coating equipment. See for example, U.S. Pat. No. 4,946,710 to, W. D. Miller, et al., entitled, "Method for Preparing PLZT, PZT and PLT Sol-Gels and Fabricating Ferroelectric Thin Films", and U.S. Pat. No. 4,963,390 to R. A. Lipeles, et al., entitled, "Metallo-Organic Solution Deposition (MOSD) Of Transparent Crystalline Ferroelectric Films". Typically, a solution containing the desired metal elements is prepared by dissolving organometallic precursors in different organic solvents, then, mixing the various solutions together. After mixing, the solution is hydrolyzed to form a sol-gel solution. Following hydrolysis, the sol-gel solution is dispensed onto a semiconductor substrate. The substrate is held stationary, or is slowly spinning until the sol-gel solution is dispensed, then, the spin speed is rapidly increased to drive off the solvents and leave a viscous sol-gel layer on the substrate surface. The amorphous sol-gel layer is then baked and sintered to form a perovskite crystalline compound having the general formula, $ABO_3$. In the PZT film, the A site is occupied by Lead, and the B site is occupied by Zirconium and Titanium. In addition, a dopant such as Lanthanum can be incorporated into the perovskite crystal in the A site location which is commonly referred to as PLZT.

While sol-gel technology has been widely used for the formation of PZT and PLZT thin films, improvement in sol-gel process is needed. In many cases, the PZT films do not exhibit optimum ferroelectric properties such as high charge storage ability needed in a DRAM, nor maximized remanent polarization necessary to meet the non-volatile memory requirements. The non-optimum ferroelectric performance is often associated with an inability to completely crystallize an amorphous PZT material into the desired perovskite crystalline phase. Additionally, the ferroelectric film compositions vary from one process run to the next leading to non-reproducible film properties. An improved sol-gel process was therefore needed to provide a high quality, crystalline PZT and doped PZT films wherein the amorphous sol-gel material is substantially converted to the perovskite crystalline phase.

BRIEF SUMMARY OF THE INVENTION

In practicing the present invention there is provided a method for making a semiconductor device having an anhydrous ferroelectric thin film. The ferroelectric film is a PZT thin film which may be doped with Lanthanum, Iron, Niobium, or Aluminum and is formed by applying an anhydrous sol-gel solution to a semiconductor substrate. In one embodiment of the invention, a semiconductor substrate is provided and an anhydrous PZT sol-gel solution is prepared. The anhydrous PZT sol-gel is synthesized in the absence of an hydrolysis step by thermally reacting Lead Acetate Anhydrous with Zirconium and Titanium precursors wherein each precursor is solubilized in a common anhydrous organic solvent. The anhydrous PZT sol-gel solution is applied to the semiconductor substrate to form an anhydrous sol-gel coating overlying the substrate. The anhydrous sol-gel coating is then crystallized to form a ferroelectric thin film.

BRIEF DESCRIPTION OF THE DRAWINGS

The sole FIGURE of the drawing schematically illustrates, in accordance with the invention, the steps for preparing an anhydrous PZT sol-gel solution and applying the anhydrous PZT sol-gel to a semiconductor substrate.

DETAILED DESCRIPTION OF THE INVENTION

The formulation method of the present invention provides a sol-gel solution for the formation of a PZT ferroelectric thin film in a semiconductor device. The PZT ferroelectric thin film is a metal oxide containing Lead and one or more metals from the group consisting of Zirconium and Titanium. In addition, the PZT film can also contain dopants such as Lanthanum, Niobium, Iron, and Aluminum. The PZT thin film is formed on a semiconductor substrate by spin-coating the sol-gel solution onto the substrate. To formulate a sol-gel solution in accordance with the present invention, an anhydrous form of Lead Acetate is used in a novel anhydrous formulation procedure. The resulting anhydrous sol-gel solution exhibits prolonged shelf-life and enhanced resistance to degradation caused by atmospheric humidity. In addition, crystalline PZT thin films formed with the anhydrous sol-gel solution have a uniform grain size and are substantially converted to the perovskite phase during sintering. Furthermore, the PZT films formed in accordance with the invention exhibit improved durability over PZT films of the prior art. The improved durability is shown by strong resistance to peeling and cracking in PZT thin films formed on silicon substrates. Furthermore, compared to PZT films formed using procedures of the prior art, the PZT thin films formed in accordance with the invention show improved ferroelectric characteristics, such as high charge storage, resistance to dielectric breakdown and high remanent polarization.

In accordance with one embodiment of the invention, a Lead-Zirconium-Titanate (PZT) sol-gel solution is formulated having varying stoichiometric amounts of Lead(Pb), Zirconium(Zr) and Titanium(Ti). Sol-gel compositions are commonly designated by the generalized formula, $PbZr_xTi_yO_3$. In the general formula, the subscripts are related as, $x+y=1.0$. The subscripts then represent moles of Zr and Ti. Following the procedure of the present invention, PZT sol-gel solutions have been prepared having number of moles of Zr ranging from $x=0.20$ to $0.65$ and the number of moles of Ti ranging from $y=0.35$ to $0.80$.

Furthermore, in many applications it is desirable to add excess Pb to the formulation. The excess Pb is often added to enhance the liquid phase sintering process carried out prior to crystallization and to replace Pb that is volatilized during thermal treatment. The formulations listed above have been prepared with excess Pb ranging from 0 to 20 mole %. As used herein, the term excess refers to any molar amount exceeding that necessary to meet the stoichiometric requirement indicated by the ideal formula $PbZrTiO_3$.

A preparation procedure for formulating and applying the anhydrous sol-gel solution of the invention is schematically illustrated in the sole FIGURE of the drawing. The procedure is preferably carried out in a nitrogen ambient to exclude atmospheric moisture. For example, all solution preparation and handling steps can be performed in a nitrogen purged glove box. To begin preparation, a selected volume of 2-Methoxyethanol(2-MOE) is preheated to about 90°–100° C. A predetermined amount of Lead (II) Acetate Anhydrous (Pb-Ac anhy), is solubilized in the preheated 2-MOE to form a Lead precursor solution, solution A. In accordance with the invention, other metal constituents can be added to the 2-MOE by the addition of a metal containing compound such as a metal alkoxide, a metal betadiketonate, or a metal acetate. For example, Lanthanum Isopropoxide can be added to the 2-MOE to form a Lead-Lanthanum precursor solution. Alternatively, the Lanthanum containing compound can be Anhydrous Lanthanum Acetate, or Anhydrous Lanthanum Acetylacetonate. In addition, metal salts can be used such as metal chlorides and nitrates, and the like.

After adding the metal precursors, solution A is boiled for an amount of time sufficient to completely dissolve all solute materials and to propagate on-going reactions. During boiling, about 5 to 10% of total solution volume is volatilized. In addition to completing the solubilization of precursors, the boiling step induces a reaction between the precursors and the 2-MOE. It is to be noted that a dehydration step to remove water from the lead acetate is not necessary because the anhydrous form of Lead Acetate is used. Furthermore, anhydrous Lead Acetate shows enhanced reactivity with other precursors used in the sol-gel formation process. This is a distinct advantage of the present invention. Formulations of the prior art wherein a dehydration step is used have not resulted in the complete removal of water from the presursor compounds, see for example "Structural Investigations of Prehydrolyzed Precursors Used in the Sol-gel Processing of Lead Titanate", S. Ramamurthi et al., J. Am. Ceram. Soc., 71, 1990.

The inventive process continues with the preparation of a solution of Zr and Ti by dissolving alkoxides of Zr and Ti in a predetermined quantity of 2-MOE to form solution B, illustrated in the Figure. The preferred alkoxides are Zirconium n-Butoxide Butanol complex and Titanium Isopropoxide, however other alkoxide compounds such as Titanium Ethoxide, Titanium Butoxide, Zirconium Ethoxide and Zirconium Propoxide, and the like, can also be used. To enhance dissolution, the 2-MOE is pre-heated to about 40°–50° C. prior to addition of the alkoxides. The solution is then gently mixed for a predetermined time.

In addition to Zr and Ti precursors, dopant atoms can also be introduced into solution B to alter the physical and electrical characteristics of the anhydrous PZT thin film produced with the sol-gel. The dopant can be a material which will affect the ferroelectric properties of the PZT thin film. Preferably, Niobium (Nb), Iron (Fe), Lanthanum (La) and Aluminum (Al) alkoxide compounds having the formula $M(OR)x$, where x can be a number ranging from 3 to 5 depending upon the particular metal, are solubilized in the Zr/Ti precursor solution. In a preferred embodiment, M is La, Fe, Nb, or Al and R is isopropyl; however, metals having other alkyl groups such as methyl, ethyl and butyl, and metal acetates such as betadiketonates, and metal salts can also be used.

In general, to maintain each precursor solution at maximum homogeneity, the dopant compounds are added to either the Pb solution or the Zr/Ti solution depending upon the atomic size and valence of the dopant atom. For example, La is added to the Pb solution because the La atom substitutes for Pb in the final perovskite crystal lattice of the PZT film. Correspondingly, Fe, Al, and Nb are added to the Zr/Ti precursor solution because their atomic size and valence correspond more closely to Zr and Ti than to Pb. The addition of dopant atoms to each precursor solution according to their atomic size relative to the results in a more homogeneous PZT thin film having a uniform concentration of each film constituent.

Also, one skilled in the art will recognize that the characteristics of the PZT thin film formed from a sol-gel solution can be affected by altering the amount of the Lead precursor. For example, as described above, an amount of Lead in excess of that necessary to meet the stiochiometric reaction requirement can be incorporated by increasing the molar amount of Pb-Ac anhy relative to the molar amounts the Ti and Zr precursors.

It should be noted that, in the present invention, a common solvent is used for precursor solutions A and B. However, many sol-gel processes of the prior art, use either a different solvent for each precursor, or, a common solvent for Pb and La, and a different solvent for Zr and Ti. As a result of solvent association, the solubilization of the metal precursors in different solvents hinders the formulation of a homogeneous sol-gel solution. In the present invention, solvent association is eliminated by the use of a common solvent for all metal precursors solutions. The solubilization of the Pb, La, Zr and Ti precursors in a common solvent results in a PZT film with few particles and striations. PZT films of the prior art are prone to striations as a result of the variation in volatility of the different solvents used for each precursor. During the spin coating process, the solvents evaporate at different rates leaving striations in the film. In addition, the use of a common solvent reduces particle formation in the PZT film during spin coating.

As previously noted, sol-gel processing of the prior art uses a different solvent for each metal precursor solution. In addition, typically, a special solvent, such as isopropyl alcohol, is used in the conduits and orifices of the spin coating machine. Particles can be formed when a sol-gel solution having a number of different solvents is introduced to the spin coater liquid distribution system. The precursor solvents interact with the spin coater solvent forming particles in the sol-gel solution. In the present invention, the use of a common solvent for all metal precursors minimizes the total number of solvents in the spin coater thereby reducing the instance of particle formation in the sol-gel solution. Solvent interaction is minimized because, at most, only two solvents are present in the spin coater; the common precursor solvent and the spin coater solvent.

Once precursor solutions A and B are prepared, an anhydrous sol-gel solution is formed by mixing solutions A and B together and boiling the mixture to form solution C. The anhydrous sol-gel solution is formed by mixing solution A into solution B while maintaining the temperature of the mixture at about 90°–100° C. After mixing, the solution is boiled for a predetermined time to induce a heterogeneous condensation reaction between the metal precursors in solution. The resulting concentrated, anhydrous sol-gel solution contains a condensate which is a complex reaction product of the metal precursors and the 2-MOE. The condensate complex is formed by a condensation reaction between the solubilized alkoxide and the butoxide precursors, and the solubilized lead acetate. The reaction is accompanied by the volatization of a portion of 2-MOE solvent and by-products of the condensation reaction.

An important aspect of the present invention includes the formation of the condensate by a thermally induced condensation reaction. In the prior art, the condensate is formed by first mixing the precursor solutions then, hydrolyzing the solution. The initiation of the condensation reaction by thermal means rather than by hydrolysis results in a more homogeneous solution. While not wishing the invention to be limited by any particular theory, the inventor believes the condensation reaction, carried out between precursors which are not complexed with water, provides a more uniform distribution of metals in solution and results in improved PZT film properties.

Following the boiling step, in one embodiment, the concentrated solution is diluted with a sufficient quantity of 2-MOE to replace the amount of solvent which was volatilized during the previous boiling steps. The dilution step, which is optional, adjusts the molar concentration of each precursor to a desired level. The diluted sol-gel solution is allowed to stand for about three hours. Next, the diluted solution is filtered through a 0.2 micron filter. The diluted sol-gel solution can now be directly applied to a semiconductor substrate, or alternatively, the solution can be stored for a period of time prior to use. In comparison to sol-gel solutions of the prior art, the anhydrous sol-gel solution of the present invention shows improved stability. The shelf-life of solution C is at least about ten to twelve weeks.

In another embodiment of the invention, rather than using an open boiling method, solutions A and C can be refluxed in a closed apparatus designed for that purpose. If refluxing is used, it is unnecessary to replace 2-MOE solvent. However, in the case of refluxing, reaction by-products remain in solution. The effect of the unvolatilized by-products must be taken into account when the PZT film is formed and may affect the film properties.

After allowing the sol-gel solution to stand for a minimum of about three hours, it can be applied to a semiconductor substrate by a conventional spin coating method. The inventive process continues by spin coating the anhydrous sol-gel solution onto a semiconductor substrate, as illustrated in the Figure. When applied to a semiconductor substrate, the sol-gel solution is applied onto the substrate surface directly from the diluted solution. Again, it should be noted that, unlike sol-gel application processes of the prior art, a hydrolysis step is not included prior to applying the sol-gel to a semiconductor substrate. In the present invention, a sol-gel solution having precursor compounds with a minimal degree of internal steric hindrance and maximum homogeneity is obtained. The addition of water, as commonly introduced by hydrolysis, would form large, bulky precursor molecules having a high degree of internal strain. In addition, hydrolyzed precursors preferentially polymerize with a single metal element. While the inventor does not wish the invention to be limited by any particular theory, it is believed that producing a sol-gel solution having precursors with a minimal degree of steric hindrance and maximum homogeneity results in a corresponding PZT thin film having a highly uniform concentration of metal atoms. The uniform concentration of metal atoms in turn provides a film having superior ferroelectric characteristics.

After the sol-gel solution is spun onto the substrate, the coated substrate is preferably baked in an oxygen containing ambient at about 250° to 350° C., for about one to ten minutes. The baking can be performed on a heated plate, or alternatively, in a convection oven. The bake drives of the 2-MOE solvent and the organic ligands attached to the metals leaving an amorphous PZT film on the substrate surface.

Finally, a sintering process is carried out to interdiffuse the metals and form a perovskite PZT thin film. The sintering process can be carried out in either a standard diffusion furnace, or in an open atmospheric oven. In a preferred embodiment, the crystallization is carried out in an oxygen containing ambient at a temperature of about 550° to 650° C. for about 5 to 30 minutes. A particular advantage of the present invention is the relatively low temperature at which formation of perovskite crystalline phase takes place. As a result of the reduced steric hindrance within the precursor molecules and good homogeneity in the sol-gel solution, a film having a more uniform metal concentration is obtained. In addition, the metals diffuse more readily during sintering. The preparation of a homogeneous sol-gel solution having less sterically hindered precursor species functions to lower the temperature at which the perovskite crystalline phase is formed. A distinguishing characteristic of the PZT film formed in accordance with the invention is the reduced incidence of an intermediate and undesired pyrochlore phase during crystallization.

Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLE I

A 0/50/50 PZT sol-gel solution having excess Pb is synthesized according to the following procedure. The precursors and solvents are commercially available from Prochem, Inc. of Rockford, Ill., as, Lead (II) Acetate Anhydrous, F.W.=325.2, Lanthanum Isopropoxide, F.W.=316.2, Zirconium n-Butoxide Butanol Complex, F.W.=387.7, Titanium Isopropoxide, F.W.=284.3, and 2-Methoxyethanol, F.W.=76.03, normal b.p. about 125° C. First, about 325 ml of 2-MOE is preheated to about 90° to 100° C. To the first preselected quantity 2-MOE, an amount of Pb-Ac anhy is added sufficient to form, preferably, a 0.307 to 1.23 molal solution, and most preferably, a 0.615 molal solution. As mentioned previously, it is often desirable to add excess Pb-Ac anhy to improve film sintering. Accordingly, preferably, about 0 to 20 mole % excess Lead and most preferably about 10 mole % excess lead is added to the solution. The addition of 0.061 moles of Pb-Ac anhy results in a solution having 0.676 moles per 1000 cubic centimeters of 2-MOE. This solution corresponds to solution A shown in the Figure.

After dissolving the Pb-Ac anhy, the Pb precursor solution is boiled for about 30 minutes without stirring. The boiling volatilizes a portion of the 2-MOE and reduces the solution volume by about 5 to 10% of total volume. The volume of solvent which is volatilized during boiling is determined by measuring the solution volume, both before and after boiling, at a base point temperature selected within the range of 90° to 100° C. This solution corresponds to solution A shown in the Figure.

Next, about 75 ml of 2-MOE is heated to about 40° to 50° C. To the second preselected quantity of 2-MOE, first, an amount of Zr n-Butoxide Butanol complex is added sufficient to form, preferably a 0.67 to 2.67 molal solution, and most preferably a 1.33 molal solution of Zr n-Butoxide Butanol complex. Then, an amount of Ti Isopropoxide is added to the second preselected quantity of 2-MOE to form, preferably a 0.67 to 2.67 molal solution, and most preferably a 1.33 molal solution of Ti Isopropoxide. Since it is desired to form an equimolar film of Zr and Ti, the molar amount of Ti added must necessarily be the same as the molar amount of Zr. The combined Zr and Ti precursor solution is then stirred for about 5 minutes while maintaining the solution temperature at about 40° to 50° C. This solution corresponds to solution B shown in the Figure.

The Zr/Ti solution is then added to the Pb precursor solution while maintaining the temperature of the mixture at about 90° to 100° C. The mixture is then boiled at about 130° C. for about 15 minutes without stirring to from the sol-gel solution. The boiling volatilizes an amount of 2-MOE reducing the volume of the mixture by about 5 to 10% of total volume. After boiling, the concentrated sol-gel solution is cooled to room temperature and the final solution volume is recorded. This solution corresponds to solution C shown in the Figure.

After a cooling period of not less than about three hours, the sol-gel solution is diluted to form a sol-gel solution preferably having molar precursor concentrations of, 0.2 to 0.8M Pb-Ac anhy, 0.1 to 0.4M Zr n-Butoxide Butanol complex, and 0.1 to 0.4M Ti Isopropoxide, and most preferably, 0.4M Pb-Ac anhy, 0.2M Zr n-butoxide butanol complex, and 0.2M Ti Isopropoxide.

The diluted sol-gel solution is then filtered through a 0.2 micron filter. The sol-gel is now ready for application to a semiconductor substrate. However, if necessary, the sol-gel solution can be stored in brown glass bottles for a period of time prior to use.

After dilution and filtration, the sol-gel solution is dispensed directly onto a semiconductor substrate using a conventional spin-coating process. About one to 5 ml of sol-gel is dispensed onto the substrate and the substrate is rotated at about 1000 to 6000 rpm to form a PZT layer on the substrate. Following spin-coating, the substrate is baked at about 250° to 350° C. for about one to 15 minutes. The baking oxidizes the organic ligands bonded to the metal atoms and drives off the 2-MOE solvent leaving an amorphous PZT film having a thickness of about 50 to 120 nanometers. Those skilled in the art will recognize that additional layers of PZT can be deposited by successive spin coating procedures. In the present Example, successive layers of PZT each having a thickness of about 50 to 120 nanometers are deposited to form a total thickness of about 250 to 750 nanometers. Finally, the substrate is sintered in an oxygen containing ambient at about 550° to 650° C. for about 5 to 30 minutes to form a PZT crystalline film having a thickness of about 150 to 500 nanometers.

EXAMPLE II

A 0/20/80 PZT sol-gel solution having 10 mole % excess Pb was prepared by the following procedure. Using the previously described starting materials, a lead precursor solution (solution A) was prepared by first preheating 325 milliliters (ml) of 2-MOE to about 90°-100° C. in a graduated flask. About 79.3 grams (g) of Pb-Ac anhy was added to the 2-MOE and the solution was gently stirred for about 5 minutes. The volume of solution was then about 360 ml at 110° C. The solution was then brought to a boil at about 130° C. and boiled for about 30 minutes without stirring. After 30 minutes, the volume of the boiled solution and the solution temperature was recorded. The solution temperature was then reduced to about 90°-100° C. where the solution volume was about 330 ml.

A Zr and Ti precursor solution (solution B) was prepared by first preheating about 75 ml of 2-MOE to about 40°-50° C. in a graduated flask. Then, about 19.15 ml of Zirconium n-Butoxide Butanol complex and about 52.8 ml of Titanium Isopropoxide were added to the 2-MOE. The solution was stirred for about 5 minutes and the volume was about 165 ml at 53° C.

A sol-gel solution (solution C) was then prepared by mixing the Pb and Zr/Ti precursor solutions (solutions A and B) together. While maintaining solution A at about 90° to 100° C., solution A was gently poured into solution B forming a mixture having a volume of about 515 ml. The mixture was stirred for about 5 minutes while maintaining the temperature at about 90° to 100° C. After stirring, the mixture was boiled at about 130° C. for about 15 minutes without stirring. The volume of solution at the end of the 15 minute boiling period was about 475 ml at 130° C. The sol-gel solution was then cooled to room temperature and the final volume was about 460 ml.

After a 3 hour stabilization period, the sol-gel solution was diluted and filtered. The dilution was carried out by adding sufficient 2-MOE to bring the total sol-gel solution volume to about 500 ml. Following dilution, the sol-gel solution was stirred for about 5 minutes and then filtered through a 0.2 micron filter. The filtration procedure was repeated and the filtrate stored in 100 ml brown glass bottles.

The anhydrous sol-gel solution was then used to form a perovskite PZT film on a semiconductor substrate according to the previously described spin-coating and sintering techniques.

EXAMPLE III

A 9/65/35 sol-gel solution having 10 mole % excess Pb was prepared by the following procedure. A solution having a 0.616 molal concentration of Pb-Ac anhy and a 0.055 molal concentration of Lanthanum Isopropoxide in 2-MOE was prepared by dissolving 65 grams of Pb-Ac anhy and 5.68 grams of Lanthanum Isopropoxide in 325 ml of 2-MOE preheated to about 90°-100° C. (solution A). In accordance with previously described procedures, the solution was stirred for about 5 minutes and brought to a boiled for about 30 minutes at about 130° C.

A Zr/Ti solution was prepared by dissolving 56.1 ml of Zirconium n-Butoxide Butanol complex and 20.8 grams of Titanium Isopropoxide in 75 ml of 2-MOE (solution B). The solution was stirred for about 5 minutes.

In accordance with previously described procedures, a sol-gel solution (solution C) was prepared by adding solution A to solution B while maintaining the solution temperature at 90° to 100° C. After stirring for about 5 minutes, solution C was boiled at about 130° C. for about 30 minutes to form a sol-gel solution. After a stabilization period, sol-gel solution was diluted with 40 ml of 2-MOE and filtered through a 0.2 micron filter.

The anhydrous sol-gel solution was then used to form a perovskite PZT film on a semiconductor substrate according to the previously described spin-coating and sintering techniques.

Thus it is apparent that there has been provided, in accordance with the invention, a method of making a semiconductor device having a PZT thin film formed from an anhydrous sol-gel solution which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other deposition methods can be used to apply the sol-gel to a semiconductor substrate such as spray pyrolysis and the like. It is therefore intended to include within the invention all such variations and modifications as fall within the scope of the appended claims and equivalents thereof.

I claim:

1. A method of making a semiconductor device comprising:
   providing a semiconductor substrate;
   preparing an anhydrous PZT sol-gel solution wherein a condensate is formed in the absence of an hydrolysis step by a thermal reaction between anhydrous Lead Acetate and Zirconium and Titanium precursors, and wherein each precursor is solubilized in an anhydrous organic solvent;
   applying the anhydrous sol-gel solution onto the substrate to form an anhydrous sol-gel coating overlying the substrate; and
   crystallizing the anhydrous sol-gel coating.

2. The method of claim 1 wherein applying the anhydrous sol-gel comprises spin coating the anhydrous sol-gel onto the surface of the semiconductor substrate.

3. The method of claim 1 wherein crystallizing the anhydrous sol-gel coating comprises thermally treating the anhydrous sol-gel coating at a temperature of 550° C. to 650° C.

4. The method of claim 1 further comprising baking the sol-gel coating in an oxygen containing ambient prior to crystallizing.

5. A method for making a semiconductor device comprising:
   solubilizing a selected amount of anhydrous Lead Acetate precursor in an anhydrous solvent to form a first solution;
   solubilizing selected amounts of metal precursors of Titanium and Zirconium in the anhydrous solvent to form a second solution;
   mixing the first and second solutions to form a mixture;
   forming a condensate in the absence of hydrolysis by heating the mixture, then cooling to room temperature;
   diluting the boiled mixture with the anhydrous solvent to form an anhydrous sol-gel solution;
   applying the anhydrous sol-gel solution to a semiconductor substrate; and
   crystallizing the anhydrous sol-gel solution.

6. The method of claim 5 further comprising baking the sol-gel solution in an oxygen containing ambient.

7. The method of claim 5 further comprising filtering the anhydrous sol-gel solution before applying the sol-gel to a semiconductor substrate.

8. The method of claim 5, wherein crystallizing the anhydrous sol-gel solution comprises thermally treating the sol-gel to form a perovskite crystal phase at a temperature of about 550° to 650° C.

9. The method of claim 5 further comprising solubilizing a Lanthanum metal precursor in the first solution.

10. The method of claim 5 further comprising solubilizing a metal precursor selected from the group consisting of Iron, Niobium, and Aluminum in the second solution.

11. A method for making a semiconductor device comprising:
    dissolving a predetermined quantity of anhydrous Lead (II) Acetate in about 325 ml of 2-Methoxyethanol preheated to about 90° to 100° C. to form a first solution;
    boiling the first solution at 125° C. for a period of time not less than 30 minutes;
    dissolving predetermined quantities of Zirconium n-Butoxide and Titanium Isopropoxide in 2-Methoxyethanol preheated to about 40° to 50° C. to form a second solution;
    mixing the first solution into the second solution with stirring to form a third solution at about 90° to 100° C.;
    boiling the third solution at about 130° C. for about 15 minutes;

diluting the third solution with 2-Methoxyethanol to form an anhydrous PZT sol-gel;

applying the anhydrous PZT sol-gel to a semiconductor substrate; and crystallizing the anhydrous sol-gel solution.

12. The method of claim 11 further comprising filtering the PZT sol-gel through a submicron filter before applying the sol-gel to a semiconductor substrate.

13. The method of claim 11 wherein an 5 to 20 mole % excess lead acetate anhydrous is added to the first solution.

14. A method of making a ferroelectric condensate for application to a semiconductor substrate comprising:

solubilizing an anhydrous Lead precursor to form a first precursor solution;

solubilizing amounts of Titanium and Zirconium precursors to form a second precursor solution;

mixing the first and second precursor solutions to form a mixture; and forming a condensate by applying heat to the mixture in the absence of hydrolysis and thermally inducing a condensation reaction between the metal precursors to form a complex condensate.

15. The method of claim 14 wherein the metal precursors forming the second precursor solution are selected from the group consisting of metal alkoxides, metal acetates, metal betadiketonates, metal chlorides and metal nitrates.

16. The method of claim 14 wherein the Titanium precursor is Titanium Isopropoxide and the Zirconium precursor is Zirconium n-Butoxide Butanol complex.

17. The method of claim 14 wherein the precursors are solubilized in anhydrous 2-Methoxyethanol.

18. The method of claim 14 wherein forming a condensate comprises heating the mixture to about 130° C. for a period of time not less than 15 minutes.

19. The method of claim 14 further comprising solubilizing one or more metal precursors selected from the group consisting of Iron, Niobium, and Aluminum in the second precursor solution.

20. The method of claim 14 further comprising solubilizing a Lanthanum metal precursor in the first precursor solution.

21. A method of making a semiconductor device comprising:

providing a semiconductor substrate;

providing an anhydrous PZT sol-gel solution, wherein the sol-gel solution comprises a condensate formed in the absence of an hydrolysis step by a thermal reaction between anhydrous Lead Acetate and Zirconium and Titanium precursors, and wherein each precursor is solubilized in an anhydrous organic solvent;

applying the anhydrous sol-gel solution onto the substrate to form an anhydrous sol-gel coating overlying the substrate; and crystallizing the anhydrous sol-gel coating.

* * * * *